United States Patent [19]

Cohen

[11] 4,405,394

[45] Sep. 20, 1983

[54] LAMINATING PROCESS

[75] Inventor: Abraham B. Cohen, Springfield, N.J.

[73] Assignee: E. I. Du Pont de Nemours and Company, Wilmington, Del.

[21] Appl. No.: 341,618

[22] Filed: Jan. 22, 1982

Related U.S. Application Data

[63] Continuation-in-part of Ser. No. 153,636, May 27, 1980, abandoned.

[51] Int. Cl.$^3$ ............................................. B32B 31/02
[52] U.S. Cl. ....................................... 156/83; 29/829;
156/64; 156/238; 156/249; 156/281; 156/301;
156/308.6; 156/308.8; 156/309.3; 156/319;
156/634; 156/659.1; 156/901; 428/901;
430/130; 430/260; 430/273; 430/319
[58] Field of Search .................... 156/83, 308.6, 238,
156/309.3, 249, 319, 281, 634, 301, 659.1, 308.8,
901, 64; 427/96, 315, 407.1; 428/901; 29/829;
430/67, 273, 69, 318, 130, 319, 260

[56] References Cited

U.S. PATENT DOCUMENTS

| | | | |
|---|---|---|---|
| 2,923,608 | 2/1960 | Margulies | 427/309 |
| 3,189,504 | 6/1965 | Whittle et al. | 156/234 |
| 3,402,087 | 9/1968 | Yackel et al. | 156/308.8 |
| 3,409,198 | 11/1968 | Peterman | 156/64 |
| 3,467,566 | 9/1969 | Conti | 156/319 |
| 3,474,719 | 10/1969 | Levinos | 430/166 |
| 3,540,966 | 11/1970 | Baker et al. | 156/281 |
| 3,547,730 | 12/1970 | Cohen | 156/345 |
| 3,629,036 | 12/1971 | Isaacson | 156/241 |
| 3,645,772 | 2/1972 | Jones | 156/639 |
| 3,767,398 | 10/1973 | Morgan | 430/318 |
| 4,069,076 | 1/1978 | Fickes | 156/83 |
| 4,075,051 | 2/1978 | Brzozowski | 156/238 |
| 4,193,797 | 3/1980 | Cohen et al. | 430/258 |

Primary Examiner—John J. Gallagher

[57] ABSTRACT

In a process for laminating a photosensitive layer to a aluminum or copper substrate surface by means of nip rolls, the improvement comprising the sequential steps of:
(a) rendering the substrate surface clean, as defined by the uniform water film test;
(b) within about 1 minute after rendering the substrate clean and immediately prior to lamination, applying a thin layer of liquid to form an interface between the substrate surface and the photosensitive layer;
(c) displacing the thin layer of liquid from the interface by absorption into the photosensitive layer during lamination, and
(d) within 30 seconds after lamination, removing the support for the photosensitive layer without delamination of the photosensitive layer from the substrate by bending the support back along a longitudinal axis of the photosensitive layer.

33 Claims, 1 Drawing Figure

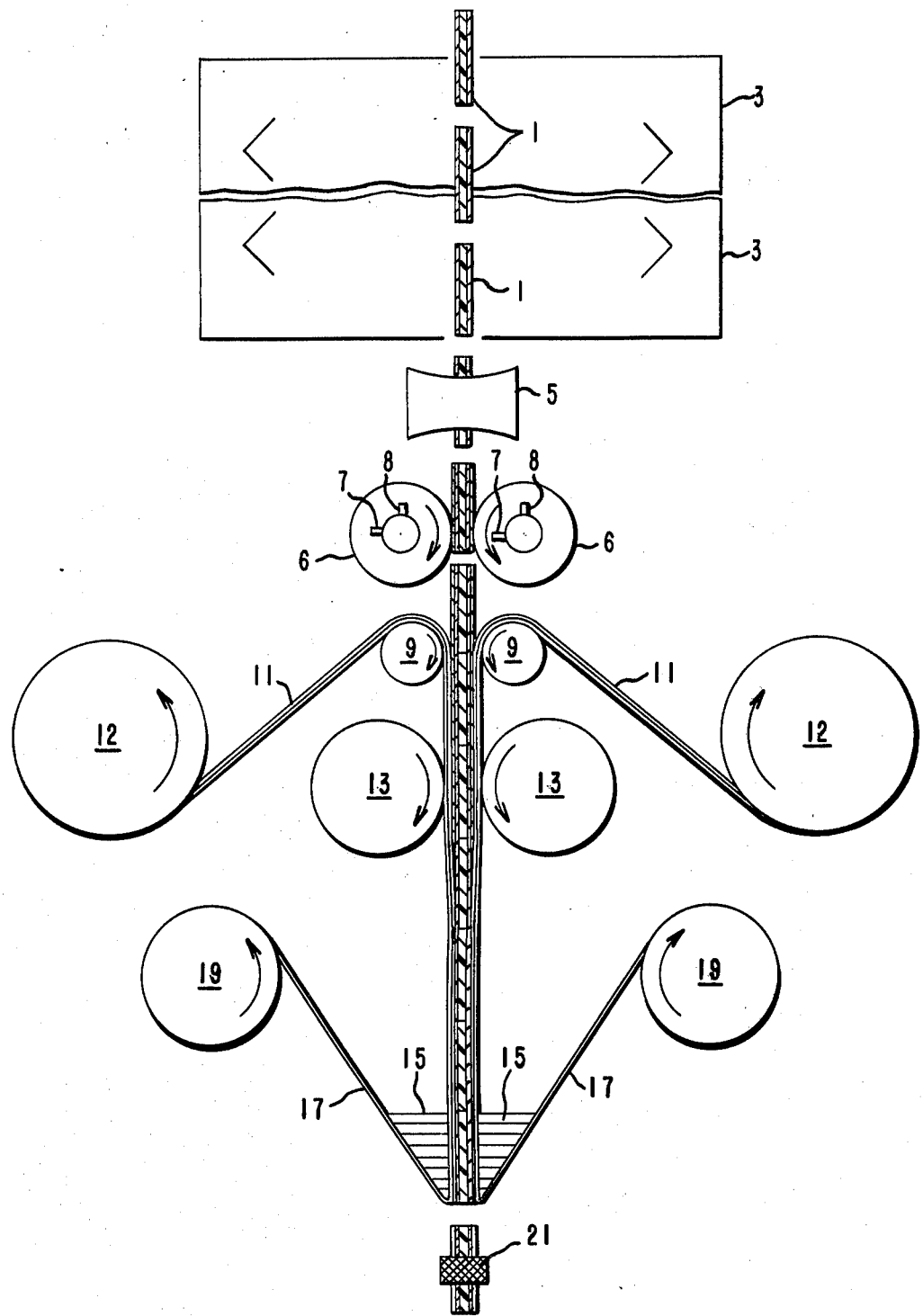

LAMINATING PROCESS

RELATED APPLICATION

This is a continuation-in-part of Ser. No. 153,636 filed May 27, 1980, now abandoned.

TECHNICAL FIELD

The invention relates to a process for laminating film-forming thermoplastic polymers to a substrate. The invention particularly relates to a process for laminating photosensitive layers to printed circuit substrates.

BACKGROUND OF THE INVENTION AND PRIOR ART

In the manufacture of printed circuit boards from conventional photoresist elements, it is necessary to laminate the photosensitive layer of the element to the substrate board in such manner that the layer is firmly adhered thereto without occlusions and other phase discontinuities such as dirt or entrapped air. Furthermore, in many manufacturing situations, it is also desirable that a strong adhesive bond be formed instantly so that subsequent operations can proceed.

U.S. Pat. No. 3,547,730 discloses the lamination of photoresist layer to a substrate by passing the layer and substrate through the nip of heated spring-loaded laminating rolls. The photoresist layer and/or the substrate may be preheated prior to the lamination step. The purpose of this heating is to enable the layer to be forced into intimate contact with the substrate under the pressure of the rolls, whereby the layer achieves sufficient adhesion to the substrate to withstand subsequent photoresist processing steps such as solvent development and etching or plating of the substrate.

U.S. Pat. No. 3,629,036 discloses the use of a solution of photoresist to coat the substrate prior to lamination with a layer of photoresist. The coating solution purportedly enables sufficient adhesion to be obtained without heating being required for lamination. The coating solution is applied by pressing wicks against the substrate.

Though the prior art methods of lamination are satisfactory for many applications, there is a need for even more precise and uniform lamination methods, especially where printed circuit boards having a very high line density are being fabricated.

SUMMARY OF THE INVENTION

The invention is therefore directed to a process which satisfies the need for reproducibly uniform lamination of thermoplastic polymers and particularly photosensitive layers, which can be described as follows:

A process for laminating by means of pressure a supported photosensitive layer to a nonporous substrate surface consisting essentially of copper or aluminum comprising the sequential steps of:
(a) rendering the copper or aluminum surface clean, the cleanliness of the surface defined by the uniform water film test;
(b) within about 1 minute after rendering the substrate surface clean and immediately prior to lamination, applying a thin layer of liquid to form an interface between the substrate surface and the photosensitive layer, said liquid layer having a thickness of at least one micron and an average thickness to about 50 microns, and
(c) displacing the thin layer of liquid from the interface by absorption into the photosensitive layer during lamination.

BRIEF DESCRIPTION OF THE DRAWING

Further advantages and details of the invention will be apparent by reference to the Drawing which consists of a single FIGURE which illustrates schematically a preferred application of the process of the invention in a continuous laminating process.

DETAILED DESCRIPTION OF THE INVENTION

A primary goal of the invention is not only to obtain very good adhesion, but also to obtain such adhesion very rapidly, that is, with nip contact during lamination of as little as about one second and preferably even less. This goal is achieved by virtue of the facts (1) that the thin layer first prepared the surface and (2) that it is then almost instantaneously displaced from the surface primarily by absorption into the photolayer. When more volatile liquids are used to form the thin film, and especially when elevated laminating temperatures are used, the thin film may be displaced to a minor extent by evaporation as well. In any event, the rapid displacement of the thin layer from the substrate surface assures that it cannot interfere with adhesion upon that surface.

In practicing this invention liquids used for treating the substrate surface comprising copper or aluminum are applied as a thin film immediately before lamination. These liquids may be applied in a separate step or as an integral part of the board prelamination cleaning operation, wherein a substrate surface is mechanically or chemically cleaned, optionally rinsed and excess liquid removed to leave sufficient liquid to form a thin layer of liquid on the substrate surface for lamination. The substrate surface is substantially planar, e.g., free of relief circuitry which would render the surface uneven. However, the surface can contain through holes to allow circuitry to be introduced in making a circuit board. In the most preferred manner of practicing the present invention, it is contemplated that flat substrates are employed which are free of holes.

The liquids useful in this invention may be solvents or nonsolvents for the thermoplastic polymer being laminated. To be useful the liquid must also be capable of being absorbed by the film or diffusing through the polymer film. Although the nonsolvent liquids useful in this invention may be capable of dissolving some components of the photoresist material, the liquids must be incapable under the conditions of lamination of dissolving the components essential for forming the photoresist, that is, the binder, monomer and initator.

Proper selection of the absorptive liquid is essential to form an instantaneous and strong bond between the thermoplastic layer and a nonporous substrate since any liquid remaining at the interface will act as a release layer and substantially weaken the bond. Instant adhesion is particularly important in high productivity or on-line processes where the film support is removed from a photosensitive thermoplastic layer within 1–2 minutes (preferably 1 to 30 seconds) after lamination of this layer to a nonporous substrate. Preferably the liquid should quickly diffuse, vaporize or be absorbed into the layer. Such liquids need not be a solvent for the thermoplastic layer and, in fact, solvents can be disadvantageous since they tend to solvate, soften, distort or concentrate at the interface, giving a weaker bond than if the liquid diffused away from the interface. The absorptive liquid may contain solids dissolved therein. It is contemplated that generally the liquid will not contain any binder for the substrate and photosensitive layer. However, it is within the scope of the present invention that the liquid does contain binder, e.g., a polymeric component.

Suitable nonsolvent liquids include water, fluorocarbons, aqueous and fluorocarbon solutions of alcohols, alkoxyalkanols, e.g., 2-ethoxy ethanol, and alkylene carbonates, e.g., ethylene carbonate, and aqueous solutions of heterocyclic compounds such as those described in U.S. Pat. No. 3,645,772, or other chelating agents. Particularly preferred are solutions of methanol or ethanol in water.

Since rapid absorption of the thin layer of liquid is important for good adhesion, it is often advantageous to provide heat to accelerate the rate of absorption of the liquid into the photosensitive film. This can be done by heating the laminating rolls used to adhere the film to the substrate or by heating the film or substrate prior to the lamination, e.g., by passing the substrate through heated rolls prior to bringing it in contact with the film. To be most effective, this temperature should be above 50° C. and below the boiling point of the liquid and distortion temperature of the supported photosensitive layer. For a film on a polyethylene terephthalate support, this upper temperature would be below 150° C.

The suitability of liquids for use in the process of the invention for laminating photosensitive layers is determined by the following test procedure referred to herein as Test A: a nine-inch by twelve-inch section of photoresist film is immersed in 1,800 cc of the test liquid for thirty seconds at room temperature and is then removed. The test liquid is evaporated down to a residue of 10 cc and coated on conventional glass microscope slides. The coated slides are exposed to mercury light of a 1 KW Colight ® DMVL-HP Exposure Source for two minutes after which the coatings are checked for hardening and color change, either of which indicates that essential components of the photoresist film were soluble in and therefore extracted by the test liquid. Substantially no hardening and substantially no color change due to essential components of a photosensitive fiber, i.e., binder, monomer and initiator, indicates the suitability of the liquid for lamination.

The thin liquid layer should cover at least 30 percent of the substrate surface on which the polymer is to be laminated preferably as a uniform layer of minute droplets. At least 80 percent coverage is preferred and essentially complete coverage is still further preferred in the form of a continuous film.

In practice, it is preferred that the thin liquid layer be as thin as is practicable. While the particular layer thickness will vary considerably, depending upon the nature of the liquid and the conditions of application, it is generally preferred that it be at least about one micron ($\mu$), the average layer thickness being about 30$\mu$ or from about 10 to about 50$\mu$.

It is an essential aspect of the invention that the applied thin liquid film be substantially displaced from the interface between the photosensitive layer and the substrate during the subsequent laminating operation. This is done mainly by absorption into the laminated polymeric layer. As used herein, the term "absorption" is not used in the usual unit operations sense, but refers to the direct transfer of the thin liquid layer under lamination pressure from the interface between the substrate and photosensitive layer into the solid photosensitive layer in which it is diffused. The precise method by which the thin liquid film is displaced is, of course, a function of the liquid and the nature of the photosensitive layer and substrate which are used. When a more volatile liquid is used in conjunction with heated laminating rolls, liquid film displacement may take place partially by vaporization. On the other hand, using a less volatile liquid and/or cooler rolls will result in less volatilization and thus removal of the liquid film will occur to a great extent by absorption into the laminated photosensitive layer. Obviously, when nonvolatile liquids are used, the removal of the film takes place essentially completely by absorption. The precise mechanism by which the liquid film is removed is not critical so long as the liquid is compatible with the laminated photosensitive layer.

Though the invention may be used advantageously in the lamination of a broad spectrum of thermoplastic layers, the invention is particularly useful for the lamination of photosensitive resist elements to substrates which are to be used for making printed circuit boards. The invention is also useful for lamination of photosensitive layers to substrates in the preparation of lithographic printing plates.

In practicing the invention, photosensitive film resist elements of various types may be used. In general photohardenable, negative-working elements are photopolymerizable elements of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270 or the nitroaromatic compositions of U.K. Pat. No. 1,547,548.

An element containing an image-yielding, nonblocking photopolymerizable stratum on a strippable support is preferably used such as the one described in copending U.S. patent application Ser. No. 153,639 filed May 27, 1980. Alternatively, particularly if the photopolymerizable layer is tacky, the remaining surface of the supported, photopolymerizable stratum may be protected by a removable cover sheet or when the element is stored in roll form, the stratum surface may be protected by the contiguous reverse surface of the support. The photopolymerizable composition is present in a dry coating thickness of about 0.0003 inch ($\sim$0.0008 cm) to about 0.01 inch ($\sim$0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch ($\sim$0.0006 cm) to 0.008 inch ($\sim$0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch ($\sim$0.0025 cm).

When the element contains no removable, protective cover sheet and is to be stored in roll form, additional protection against blocking can optionally be provided if the reverse side of the strippable support preferably has applied thereto a thin release layer of a material, such as wax or silicone, to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer.

When the invention is used in applications in which very rapid adhesion is needed, for example, the self-trimming process disclosed in copending U.S. patent application Ser. No. 153,634 filed May 27, 1980 and refiled as Ser. No. 244,792 filed Mar. 27, 1981, filed concurrently herewith, it is essential that the adhesion ($A_1$) of the unexposed photosensitive layer to the polymeric support exceed the breaking strength (B) of the unsupported photosensitive layer. Likewise, the adhesion ($A_2$) of the unexposed photosensitive layer to the substrate must exceed the breaking strength (B) of the unsupported photosensitive layer. In addition, since the polymeric support must be strippable from the laminated photopolymerizable layer, the adhesion ($A_2$) of the photolayer to the substrate must also exceed its adhesion ($A_1$) to the polymeric support. Expressed mathematically, $A_2 > A_1 > B$. The proper balance of these adhesive and breaking forces in photosensitive systems can be provided by adjustment of the relative proportions of monomer and binder.

The photohardenable layer is prepared from polymeric components (binders), monomeric components, initiators and inhibitors.

Suitable binders which can be used as the sole binder or in combination with others include the followng: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers; e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Preferably, the binder should contain sufficient acidic or other groups to render the compositions processible in aqueous developer. Useful aqueous-processible binders include those disclosed in U.S. Pat. No. 3,458,311 and in U.K. Pat. No. 1,507,704. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-dydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz (a) anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos.2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoiniators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluguinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing filler. Thermosetting resin with reinforcing fillers are ordinarily used for rigid boards, whereas thermoplastic resin without reinforcements are usually used for flexible circuit boards. Ceramic and dielectric-coated metals are also useful. The materials from which the board is made may, of course, influence the choice of liquid for the thin layer.

Typical board construction involves combinations such as phenolic or epoxy resins on paper or a paper-glass composite, as well as polyester, epoxy, polyimide, polytetrafluorethylene, or polystyrene on glass. In most instances, the board is clad with a thin layer of electroconductive metal of which copper is by far the most common.

Suitable substrates for the process of the invention involving preparation of lithographic printing plates are those which have mechanical strength and surfaces which differ in hydrophilicity or oleophilicity from the surfaces of the imaged photosensitive areas laminated thereto. Such substrates are disclosed in U.S. Pat. No. 4,072,528. While numerous substrates are satisfactory for this purpose thin anodized aluminum plates such as those disclosed in U.S. Pat. No. 3,458,311 are particularly useful.

As noted above, the adhesion of the unexposed photosensitive layer to substrates such as copper or aluminum ($A_2$) must be greater than its adhesion to the support ($A_1$). A high value for $A_2$ is also needed for many of the applications of this invention where the photoresist layer must remain adhered to the substrate during exposure to severe chemical or mechanical conditions.

It is essential that the printed circuit substrates used in the process of the invention be clean and free of any extraneous material which might render any significant amount of the surface nonwettable. For this reason, it will be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying.

Suitable cleanliness can be very easily determined by dipping the substrate into water, removing it from the water and observing the board surface. If a uniform film of water is observed, the board is adequately clean but if a discontinuous streaked film or large droplets are formed, the board is not sufficiently clean to be used in the process of the invention, which requires instant adhesion following lamination. According to this invention, lamination must take place within one minute to prevent degradation of the cleaned surface.

The inert liquid used to form the thin film can be applied in several ways, for example, by brushing, wicking or by rolling it on using perforated or porous rolls.

The invention will be more clearly understood by reference to the following examples and the detailed description of the Drawing hereinbelow.

EXAMPLE I

Resist Properties

A roll of photoresist film having no cover sheet is prepared as follows:

A photosensitive coating solution is prepared having the following composition:

| | Component | Parts by Weight |
|---|---|---|
| (a) | 1:1 Copolymer of styrene and maleic anhydride partially esterified with | 40 |

|     | Component | Parts by Weight |
| --- | --- | --- |
|     | isobutyl alcohol; mol. wt. ca. 20,000; acid number ca. 180 | |
| (b) | Terpolymer of 7% ethyl acrylate, 71% methyl methacrylate, and 12% acrylic acid; mol. wt. ca. 300,000; acid number ca. 105 | 12.6 |
| (c) | Interpolymer formed from 40% N—tert.-octyl acrylamide, 34% methyl methacrylate, 16% acrylic acid, 6% hydroxy propyl methacrylate, and 4% t-butyl amino ethyl methacrylate; mol. wt. ca. 50,000 | 5 |
| (d) | Polyoxyethylated trimethylolpropane triacrylate (20 moles of ethylene oxide) (M.W. 1162) | 10 |
| (e) | Trimethylolpropane triacrylate | 12.5 |
| (f) | Benzophenone | 4 |
| (g) | 4,4'-Bis(dimethylamino) benzophenone (Michler's ketone) | 0.7 |
| (h) | 2,2'-Bis(2-chlorophenyl)-4,4',5,5'-tetraphenyl biimidazole | 3 |
| (i) | Leuco crystal violet | 0.4 |
| (j) | Benzotriazole | 0.2 |
| (k) | 1,4,4-Trimethyl-2,3-diazobicyclo-[3.2.2]-non-2-ene-2,3-dioxide | 0.06 |
| (l) | Victoria Green (C.I. Pigment Green 18) | 0.03 |
| (m) | Methylene chloride | 200 |
| (n) | Methanol | 15 |

Into the above coating solution are dispersed 13 parts by weight of polyethylene beads of which 85% have diameters below 10μ and 15% have diameters between 10 and 20μ. The mixture is coated on a 0.00127 cm thick poly(ethylene terephthalate) web which has coated on its reverse side a thin layer of a mixture of Carnuba wax and poly(vinylidene chloride). The photopolymerizable layer is dried to give a dry thickness of 0.00254 cm and about 30.5 meters of the dried coated element is wound into a roll.

DETAILED DESCRIPTION OF THE DRAWING

Turning now to the drawing, each member of a series of substrates for printed circuit 1 is mechanically advanced in a continuous manner on a roller conveyor through cleaning chamber 3 in which both the upper and lower copper-clad surfaces thereof are cleaned by mechanically scrubbing under a heavy water spray. The boards are made of fiberglass-reinforced epoxy resin. The substrate boards, which are clean as defined by the uniform water film test, are further advanced through alignment rolls 5 by which the sides of the boards are precisely aligned. From the alignment rolls 5, each aligned board emerges and is passed between liquid application rolls 6 into which thin layer liquid (in this case, water) is admitted via line 7 into the interior of the hollow application rolls 6. Preferably the application rolls 6 consist of a metal core perforated in a regular pattern having thereon a hard porous polyethylene sleeve which is covered with a cotton cloth through which the thin layer liquid passed and is coated onto the substrate. Liquid level within the application rolls 6 is limited by fixed level outlet line 8. The board with both surfaces coated with a thin layer of water is then advanced to a set of upper and lower feed rolls 9 each of which places the unprotected surface of the photosensitive layer of the continuous resist film 11 from Example I against the thin layer. The feed rolls 9 are mechanically linked with the mechanism used for advancing the boards 1 in such manner that the boards are butted up against one another as they enter the feed rolls 9 and there is no significant amount of bridging by the film 11 between the trailing and leading edges of each board. The laminating film prepared as described in Example I is supplied from supply roll 12. The abutting boards 1 with the film resist 11 in place is then advanced through the nips of heated laminating rolls 13 in which the film layers 11 are subjected to both pressure and heat, by which the thin water layer on the photosensitive layer is removed from the substrate mainly by absorption into the photosensitive layer. The temperature of the laminating roll surfaces is about 230° F. and the linear speed of the boards through the laminator is about six feet per minute. Minor amounts of water are removed by evaporation. Lamination is completed within about 40 seconds after the board is cleaned. The lapsed time between surface treatment and lamination was about 5 seconds. The laminated boards 1 still abutting each other, are advanced at a uniform rate between wedges 15. At the exit of the wedges 15, the polyethylene terephthalate web 17 on the outer surface of the continuous film is pulled back uniformly from the substrate at an obtuse angle (here 150°) which causes the photosensitive layer to be trimmed in a straight line along the leading edge of the board 1). The web 17 is pulled back by the action of take-up rolls 19 and the advancing action of the board. As the substrate board 1 emerges from between wedges 15 progressively more of the photosensitive layer is uncovered until the board advances to and is grasped firmly at the sides between a pair of clutch-driven, rapidly rotating trimming rolls 21 (only one is shown) which rotate at a speed faster than the linear speed of the advancing board until they grasp the panel sides. The trimming rolls then move with the linear speed of the board by means of a slip clutch which compensates for the difference in driving speeds. The trimming rolls 21 place a transverse tensile stress on the board which causes the thermoplastic layer to be trimmed smoothly along the trailing edge of the board as it emerges from between the wedges 15. When the trailing edge trimming is completed, thus separating the leading and trailing boards in the series, the laminated board is ready for circuit preparation by conventional photoresist techniques.

When the advancing substrate elements are butted against each other in such manner that there is no significant space between the trailing edge of the leading board and the leading edge of the following board, a single application of transverse tensile stress to the layer operates to trim the layer simultaneously from both the trailing edge of the leading board and the leading edge of the following board. On the other hand, when successive boards are spaced in such manner that there is a "budge" of photosensitive layer spanning the gap between the trailing edge of the leading board and the leading edge of the following board, it is necessary to trim the two edges separately. In this case, the transverse tensile stress to trim the leading edge of the boards is applied preferably by removing the support film from the layer as the laminated substrate element emerges from the nip of the laminating rolls by bending the film back along the longitudinal axis of the advancing layer at an obtuse angle, the radius of the bend being sufficiently small that the breaking strength of the layer on the leading edge of the substrate element is exceeded.

In a preferred aspect, the process is simultaneously practiced on both sides of the succession of substrates so that photopolymerizable layer is laminated to both sides of the substrates. In this instance, it is especially important that no liquid be present in the holes in the substrate, lest the heat of lamination vaporize the liquid and cause the "tents" of photosensitive layer over the holes in the substrate to expand and burst. It is also preferred that the succession of substrates be close enough that the spring-loaded lamination rolls normally used for lamination do not "bottom" between substrates. This avoids bonding together of the two photopolymerizable layers extending between the successive substrates, that is the "hinges" between successive substrates, since such bonding is likely to interfere with self-trimming of the leading edge when the support films are removed. Alternatively, the pressure on the lamination rolls can be reduced to minimize bonding of the layers. It is preferred, however, that "hinging" itself to be kept to a minimum to facilitate the self-trimming function.

Though the process of the invention as described above is carried out continuously, it will be recognized that the process can also be conducted intermittently as well.

EXAMPLE II

Importance of Cleaning

A. Two boards of the type described in Example I which have been handled and have fingerprints on the copper surfaces are used in the following test: one board is cleaned and dried in the manner described above and is found to be "clean" as measured by the above-described water film test. Water is applied to the surface of both boards by wiping the surfaces with water saturated tissue.

The water on the clean board is a uniform film with no apparent discontinuities while the water on the uncleaned board is streaked on the surface. Both boards are then laminated with the film of Example I as described above using hot nip rolls at a rolled surface temperature of 230° F. When subjected to a tape delamination test as described below the polymer laminated to the clean board does not delaminate while the polymer laminated to the board which has not been cleaned encourages substantial delamination.

In the above-referred tape delamination test, a six-inch length of one-inch wide Scotch ® brand black poly/paper masking tape is firmly applied to the laminated photosensitive surface and then one edge is pulled away from the surface. Lamination is unsatisfactory if any of the photosensitive layer is pulled off with the tape.

B. To demonstrate the criticality in the time between cleaning of a substrate and lamination, the following test was conducted; Somaca ® cleaned copper boards were held in contact with air for stated periods of time after cleaning followed by wetting of the copper surface. The boards were inclined at an angle of 45° and 90° and the boards observed for water beading. The results are as follows:

| Board Hold Time | Water Bead |
| --- | --- |
| 0 seconds | Satisfactory |
| 30 seconds | Satisfactory |
| 60 seconds | Satisfactory |
| 2 minutes | Borderline |
| 3 minutes | Unsatisfactory (Little break at top) |

| Board Hold Time | Water Bead |
| --- | --- |
| 6 minutes | Unsatisfactory (Little break at top) |
| 10 minutes | Unsatisfactory (Little break at top) |

In making circuit boards, it is considered that subsequent processing steps would generally tend to lead to more failures for board surfaces, which did not provide satisfactory test results in the water bead test in comparison to boards which provided satisfactory results.

EXAMPLE II

Positive Photoresist Lamination

A photosensitive coating composition is prepared as follows:

| | Component | Parts by Weight |
| --- | --- | --- |
| (a) | Methyl methacrylate/methacrylic acid (92/8) copolymer medium molecular weight | 54.4 |
| (b) | Trimethylolpropane triacrylate | 36 |
| (c) | 2,2'-Bis(2-chlorophenyl)-4,4',5,5'-tetraphenyl biimidazole | 3 |
| (d) | Triethyleneglycol diacetate | 1 |
| (e) | Tricresyl phosphate | 3 |
| (f) | 3-[N—ethyl-2,3,4-trihydro-1H—benzo[b]-pyridin-6-yl]methylidyne-2,3-dihydro-4-H—1-benzopyran-4-one | 1 |
| (g) | 4,5-Dimethoxy-2-nitro-1[-1[4(1,1-dimethyl ethyl)phenoxy]ethyl]-benzene | 4 |
| (h) | Benzotriazole | 0.2 |
| (i) | CI-109 Red Dye | 0.3 |
| (j) | Methylene chloride | 150 |
| (k) | Methanol | 11 |
| (l) | Polyethylene beads of Example I | 15 |

The mixture is coated on a 0.00127 cm thick polyethylene terephthalate web and dried to give a photosensitive layer with a dry thickness of 0.00254 cm.

The photosensitive layer is laminated to one side of cleaned copper-clad substrate boards and self trimmed as in Example I except that the thin layer of liquid consists of 30% ethanol in water.

Each of the laminated and trimmed boards is imaged by exposing for sixty seconds the photosensitive layer to UV radiation from a Colight ® DMVL-HP light source passing through transparent portions of a phototool corresponding to a printed circuit pattern. The phototool is then removed and replaced with a filter which is opaque to UV radiation below 4000 A and the boards are uniformly exposed for sixty seconds to the visible light of the Colight ® DMVL-HP light source. The imagewise exposed areas are completely removed by development in an aqueous solution of 9% ethyleneglycol monobutyl ether and 1% sodium borate. The imaged and developed laminate is ready for circuit preparation by conventional plating and etching photoresist techniques.

EXAMPLE IV

Example I is repeated using a 1% aqueous solution of benzotriazole hydrochloride as the thin liquid layer and with a 10% methanol solution in trichlorotrifluroethane. In both instances, lamination and self trimming is satisfactory and the resulting laminated boards can be conventionally imaged and processed to produce printed circuits.

EXAMPLE V

Preparation of a Lithographic Printing Plate

A photosensitive coating mixture was prepared and coated as in Example I except that instead of the beads used therein, 16 parts by weight of 1 micron polyethylene beads (Microfine VIII - F. Gold, tradename of Dura Commodities Corporation, Harrison, NY) were dispersed in the coating solution. The surface of a 0.023 cm thick aluminum plate was scrubbed with tungsten carbide brushes in water using a Chemcut ® Model 107 (tradename of Chemcut Corporation, State College, PA) Mechanical Cleaning System and the scrubbed surface was laminated to the photosenstive layer and the layer trimmed as described in Example I.

The laminated and trimmed board was imaged by exposing for 60 seconds the photosensitive layer through a halftone and line transparency to U.V. radiation from a 2000 watt pulsed Xenon arc light source in a flip top platemaker. The unexposed areas were completely removed by development in a 1% aqueous solution of sodium carbonate to provide a halftone polymeric image with complimentary image areas of bare aluminum surface. The resulting lithographic printing plate was conventionally gummed with Lydex ® Finishing Solution (LDFS) (tradename of E. I. du Pont de Nemours and Company, Wilmington, DE) and mounted on an A. B. Dick Model 380 offset printing press. Using standard inking and fountain solutions, at least 3500 copies of good quality were obtained from the printing plate.

I claim:

1. In a process for laminating by means of pressure a strippable film supported photosensitive layer to a cleaned nonporous substrate surface consisting essentially of copper or aluminum, the improvement comprising the sequential steps of:
    (a) rendering the copper or aluminum substrate surface clean, the cleanliness of the surface being defined by the uniform water film test;
    (b) within about 1 minute after rendering the substrate surface clean and immediately prior to lamination, applying a thin layer of liquid to form an interface between the substrate surface and the photosensitive layer;
    (c) displacing the thin layer of liquid from the interface by absorption into the photosensitive layer during lamination; and
    (d) within 30 seconds after lamination, removing the support for the photosensitive layer without delamination of the photosensitive layer from the substrate by bending the support back along a longitudinal axis of the photosensitive layer.

2. The process of claim 1 in which the thin layer is applied by rolling, brushing or wicking the liquid onto the substrate.

3. The process of claim 1 in which the lamination is conducted by means of heated nip rolls.

4. The process of claim 1 in which the liquid is selected from the group consisting of water, $C_{1-4}$ alkanols and aqueous solutions of $C_{1-4}$ alkanols.

5. The process of claim 1 in which the liquid is aqueous.

6. The process of claim 1 in which the liquid has solids dissolved therein.

7. The process of claim 6 in which the liquid has dissolved therein a chelating agent for the substrate surface.

8. The process of claim 1 wherein in step (b), said liquid layer has a thickness of at least one micron and an average thickness to about 50 microns.

9. The process of claim 1 in which the bending radius of the support is sufficiently small that the breaking strength of the photosensitive layer at the leading edge of the substrate is exceeded, thus evenly trimming the photosensitive layer therefrom.

10. The process of claim 1 wherein the substrate is cleaned by mechanical scrubbing prior to lamination.

11. The process of claim 1 wherein the substrate contains holes.

12. The process of claim 1 wherein the substrate contains holes and liquid is not present in the holes during lamination.

13. The process of claim 1 wherein the liquid is a solvent for the photosensitive layer.

14. The process of claim 1 wherein the liquid is a nonsolvent for the photosensitive layer.

15. The process of claim 14 wherein the photosensitive layer comprises a thermoplastic polymer.

16. In a process for laminating by means of pressure a strippable film supported photosensitive layer to a cleaned nonporous substrate surface consisting essentially of copper or aluminum, the improvement comprising the sequential steps of:
    (a) rendering the copper or aluminum substrate surface clean, the cleanliness of the surface being defined by the uniform water film test;
    (b) within about 1 minute after rendering the substrate surface clean and immediately prior to lamination, applying a thin layer of liquid to form an interface between the substrate surface and the photosensitive layer;
    (c) displacing the thin layer of liquid from the interface by absorption into the photosensitive layer during lamination;
    wherein the adhesive force ($A_1$) of the unexposed photosensitive layer to the support exceeds the breaking force (B) of the unsupported photosensitive layer, the adhesive force ($A_2$) of the unexposed photosensitive layer to the substrate exceeds the breaking force (B) of the unsupported photosensitive layer and the adhesive force ($A_2$) of the photosensitive layer to the substrate exceeds its adhesive force ($A_1$) to the support and wherein the adhesive relationship $A_2 > A_1 > B$ is present; and
    (d) within 30 seconds after lamination, removing the support for the photosensitive layer without delamination of the photosensitive layer from the substrate by bending the support back along a longitudinal axis of the photosensitive layer.

17. The process of claim 16 in which the thin layer is applied by rolling, brushing or wicking the liquid onto the substrate.

18. The process of claim 16 in which the lamination is conducted by means of heated nip rolls.

19. The process of claim 16 in which the liquid is selected from the group consisting of water, $C_{1-4}$ alkanols and aqueous solutions of $C_{1-4}$ alkanols.

20. The process of claim 16 in which the liquid is aqueous.

21. The process of claim 16 in which the liquid has solids dissolved therein.

22. The process of claim 21 in which the liquid has dissolved therein a chelating agent for the substrate surface.

23. The process of claim 16 wherein in step (b), said liquid layer has a thickness of at least one micron and an average thickness to about 50 microns.

24. The process of claim 16 in which the bending radius of the support is sufficiently small that the breaking strength of the photosensitive layer at the leading edge of the substrate is exceeded, thus evenly trimming the photosensitive layer therefrom.

25. The process of claim 16 wherein the substrate is cleaned by mechanical scrubbing prior to lamination.

26. The process of claim 16 wherein the substrate contains holes.

27. The process of claim 26 wherein the substrate contains holes and liquid is not present in the holes during lamination.

28. The process of claim 16 wherein the liquid is a solvent for the photosensitive layer.

29. The process of claim 16 wherein the liquid is a nonsolvent for the photosensitive layer.

30. The process of claim 29 wherein the photosensitive layer comprises a thermoplastic polymer.

31. The process of claim 16 wherein the support is polymeric.

32. The process of claim 16 wherein the photosensitive layer is photopolymerizable.

33. The process of claim 16 wherein the support is polymeric and the photosensitive layer is photopolymerizable.

* * * * *